United States Patent [19]

Feely

[11] Patent Number: 5,391,465
[45] Date of Patent: Feb. 21, 1995

[54] METHOD OF USING SELECTED PHOTOACTIVE COMPOUNDS IN HIGH RESOLUTION, ACID HARDENING PHOTORESISTS WITH NEAR ULTRAVIOLET RADIATION WHEREIN THE PHOTORESIST COMPRISE CONVENTIONAL DEEP UV PHOTOACID GENERATORS

[75] Inventor: Wayne E. Feely, Rydal, Pa.

[73] Assignee: Rohm and Haas Company, Philadelphia, Pa.

[21] Appl. No.: 511,890

[22] Filed: Apr. 19, 1990

Related U.S. Application Data

[63] Continuation of Ser. No. 369,438, Jun. 20, 1989, abandoned.

[51] Int. Cl.$^6$ ............................ G03F 7/30; G03F 7/40
[52] U.S. Cl. .................................. 430/325; 430/270; 430/330; 430/920; 430/922; 430/925; 430/926
[58] Field of Search ............... 430/270, 325, 920, 922, 430/926, 925, 330

[56] References Cited

U.S. PATENT DOCUMENTS

| | | | |
|---|---|---|---|
| 4,343,885 | 8/1982 | Reardon et al. | 430/270 |
| 4,442,197 | 4/1984 | Crivello et al. | 430/270 |
| 4,491,628 | 1/1985 | Ito et al. | 430/176 |
| 4,548,890 | 10/1985 | Dickinson et al. | 430/280 |
| 4,632,891 | 12/1986 | Banks et al. | 430/270 |
| 4,659,649 | 4/1987 | Dickinson et al. | 430/270 |
| 4,816,379 | 3/1989 | Bronstert et al. | 430/922 |
| 4,983,498 | 1/1991 | Rode et al. | 430/284 |
| 5,034,304 | 7/1991 | Feely | 430/270 |

FOREIGN PATENT DOCUMENTS

| | | | |
|---|---|---|---|
| 0153889 | 12/1979 | Japan | 522/16 |
| 232972 | 12/1987 | United Kingdom . | |

OTHER PUBLICATIONS

Journal of Imaging Technology, vol. 11, No. 4, Aug. 1985, pp. 146–157, Springfield, Va.

*Primary Examiner*—Charles L. Bowers, Jr.
*Assistant Examiner*—John S. Chu
*Attorney, Agent, or Firm*—Terence P. Strobaugh

[57] ABSTRACT

A method is provided for using selected photoactive compounds in acid hardening photoresists to produce thermally stable, high resolution images with near ultraviolet exposing radiation. These photoactive compounds can be used as photosensitizers for halogen-containing photoacid generators which by themselves do not otherwise generate sufficient acid upon exposure to near ultraviolet radiation to catalyze the crosslinking of acid hardening resins. The photoactive compounds are selected from the group consisting of phenothiazine, derivatives of phenothiazine, and phenoxazine.

11 Claims, No Drawings

1

METHOD OF USING SELECTED PHOTOACTIVE COMPOUNDS IN HIGH RESOLUTION, ACID HARDENING PHOTORESISTS WITH NEAR ULTRAVIOLET RADIATION WHEREIN THE PHOTORESIST COMPRISE CONVENTIONAL DEEP UV PHOTOACID GENERATORS

CROSS REFERENCE TO RELATED APPLICATIONS

This application is a continuation of application Ser. No. 369,438, filed Jun. 20, 1989, now abandoned.

This invention is related to my copending U.S. patent applications Ser. No. 616,518 filed Jun. 1, 1984 entitled Thermally Stable Polymer Images and Processes and Ser. No. 818,430 filed Jan. 13, 1986 entitled Photosensitive Compounds and Thermally Stable, Aqueous Developable, Negative Images and Ser. No. 818,571 filed Jan. 13, 1986 entitled Microplastic Structures.

BACKGROUND OF THE INVENTION

This invention relates to a method of using selected photoactive compounds with acid hardening resins to produce thermally stable, submicron images using near ultraviolet radiation.

Workers in the field of photolithography desire photoresists capable of producing images with submicron resolution. My prior application Ser. No. 616,518 is directed to a dual acting aqueous developable polymer coating composition containing an acid hardening resin system and a photoacid generator which produces carboxylic acid upon exposure to actinic radiation such as, for example near ultraviolet radiation, leading to images having a resolution as low as about 0.7 microns. My prior application Ser. No. 818,430 disclosed an acid hardening negative acting photoresist composition capable of producing even higher resolution, down to about 100 nanometers, utilizing short wavelength actinic radiation such as, for example; deep ultraviolet, x-ray and electron beam radiation. The halogen-containing photoacid generators used in that invention are useful with short wavelength radiations but do not produce sufficient acid upon exposure to near ultraviolet radiation to catalyze the crosslinking of the acid hardening photoresist. Accordingly, the photoresists containing these photoacid generators can not be employed for use with near ultraviolet radiation to produce submicron images.

Recently a number of photolithographic imaging equipment manufacturers have announced advances in lenses and imaging systems capable of focusing near ultraviolet radiation to submicron dimensions.

Since conventional near ultraviolet photoresists are not capable of providing thermally stable high resolution submicron images (U.S. Pat. Nos. 3,692,560; 3,697,274; 3,890,152; and 4,404,272), these photoresists cannot be utilized with such advanced lenses and imaging systems to produce thermally stable, submicron images.

U.S. Pat. No. 3,042,51 5 discloses printout compositions which produce a color change upon exposure to ultraviolet light. The composition contains one or more aryl amines and one or more halogenated compounds. The use of diphenylamine, triphenylamine and N-phenyl-1-naphthyl-amine along with iodoform, carbon tetrachloride and carbon tetrabromide is disclosed.

U.S. Pat. No. 4,634,657 discloses photoimaging compositions which produce improved color comprising substituted 1,2-dibromoethane compounds, a leuco dye, optional monomeric compound and a photoinitiator. Among extensive lists of useful leuco dyes, aminophenothiazine and aminophenoxazine are included. There is no teaching or suggestion in this disclosure of the production of photoresists.

OBJECTS OF THE INVENTION

It is therefore an object of the present invention to provide photoactive compounds which can be employed with acid hardening resin systems to produce negative thermally stable, highly resolved submicron images utilizing near ultraviolet radiation.

Another object of the invention is to provide a resist that is stable upon exposure to radiation in the visible range. Another object of the invention is the production of a thick resist, on the order of 250 microns having straight wall profiles.

Still another object of the invention is a method of producing images that become detached from the substrate on which they are produced during the development step.

SUMMARY OF THE INVENTION

A method is provided for using selected photoactive compounds and acid hardening resin systems to produce photoresist compositions which produce thermally stable, high resolution submicron images when exposed to near ultraviolet radiation.

In one embodiment, the present invention relates to negative resists that contain an acid hardening resin system, a photoacid generator that does not otherwise generate acid upon exposure to near ultraviolet radiation at wavelengths of from about 365 nm to about 406 nm and a sensitizer which promotes the production of acid by the photoacid generator when exposed to radiation at these wavelengths and its use in preparing both thin and thick images.

The sensitizers of the present invention are selected from phenothiazine and derivatives thereof, and phenoxazine. Preferred phenothiazine derivatives are 10-methylphenothiazine, 2-trifluoromethylphenothiazine and 2-chlorophenothiazine.

In another embodiment the invention relates to the use of 2-chlorophenothiazine as a photoacid generator in an acid hardening resist.

In another embodiment the invention relates to the application of a thin coating of water soluble polymer to the surface of the substrate on which the acid hardening photoresist is to be subsequently applied and imaged. By first producing a crosslinked image the image will be freed from the substrate upon aqueaous development from which the images can be recovered by filtration or centrifuging or similar means.

DETAILED DESCRIPTION OF THE INVENTION

Near ultraviolet or near UV radiation as used herein is defined to mean radiation having a wavelength in the range of from greater than about 350 nanometers to about 450 nanometers. Mercury vapor lamps are a common source of ultraviolet radiation and produce near UV radiation having three peak wavelengths at about 365 nanometers, 406 nanometers and 436 nanometers. These peak wavelengths are referred to by the industry as I, H and G lines respectively. The photosensitizers of the present invention respond to near ultraviolet light from 365 nanometers to about 406 nanometers (I and H lines).

Before describing the selected photoactive compounds used in the process of the invention it is necessary to describe what is meant by acid hardening resin systems.

ACID HARDENING RESINS SYSTEMS

Acid hardening resin systems are mixtures of polymers which cure, crosslink or harden by the catalytic action of acids upon heating. In order for an acid hardening resin system to be useful in this invention, it must, in the uncured state, be soluble in a non-reacting solvent or solvent mixture and must be capable of forming a homogeneous, uniform, non-tacky, adherent film, free of cracks, crazing and other defects, on the substrate surface onto which it is applied. Acid hardening resin systems are well known and can be prepared from a wide variety of aminoplast or phenoplast polymers alone or in combination with compounds or low molecular weight polymers containing a plurality of hydroxyl, carboxyl, amide or imide groups. The acid hardening resin system comprises either a mixture of aminoplast resin and a reactive hydrogen containing compound or a phenoplast resin. The phenoplast resin can be either a resol resin or a mixture of novolac and a latent formaldehyde generating compound. The selection of the acid hardening resin system suitable for use in the photoresist of the invention may be made by one of ordinary skill in the art depending on the choice of solvent employed and is not asserted to be critical to the present invention.

Aminoplast resins suitable for use in the acid hardening system include urea-formaldehyde, melamine-formaldehyde, benzoguanamine-formaldehyde, glycoluril-formaldehyde resins and combinations thereof. Polymeric aminoplasts may be prepared by the reaction of acrylamide or methacrylamide copolymers with formaldehyde in an alcohol-containing solution, or alternatively by the copolymerization of N-alkoxymethyl acrylamide or methacrylamide with other suitable monomers. Examples of some suitable aminoplasts include the melamine resins manufactured by American Cyanamid Company such as Cymel ® 300, 301,303, 350, 370, 380, 1116 and 1130; benzoguanamine resins such as Cymel ® 1123 and 1125; glycoluril resin Cymel ® 1170 1171, 1172; and urea-based resins Beetle ® 60, 65 and 80. A large number of similar aminoplasts are presently commercially available from various suppliers.

As indicated above the aminoplasts are used in combination with reactive hydrogen-containing compounds in the acid hardening resin system. These reactive hydrogen-containing compounds include: novolac resins; polyvinylphenols; and copolymers of these with styrene, α-methylstyrene, acrylic resins, etc. polyglutarimides; polyacrylic acid or polymethacrylic acid copolymers; alkali-soluble polyacrylamides and polymethacrylamide copolymers; copolymers containing 2-hydroxyethyl(meth)acrylate and 2-hydroxypropyl(meth)acrylate; and polyvinyl alcohols such as those prepared from partially hydrolyzed polyvinyl acetates; alkali-soluble styrene-allyl alcohol copolymers; and mixtures thereof. Novolac resins containing hydroxyl groups and sites for the electrophilic substitution of aromatic rings at positions ortho or para relative to the hydroxyl group are preferred. Novolac resins that are useful in conjunction with aminoplasts in the acid hardening resin system are alkali-soluble film forming phenolic resins having a molecular weight (weight average) ranging from about 300 to about 100,000 and preferably from about 1000 to 20,000. These novolac resins may be prepared by the condensation reaction of a phenol, a naphthol or a substituted phenol, such as; cresol, xylenol, ethylphenol, butylphenol, isopropyl methoxyphenol, chlorophenol, bromophenol, resorcinol, naphthol, chloronaphthol, bromonaphthol or hydroquinone with formaldehyde, acetaldehyde, benzaldehyde, furfural acrolein or the like. Blends of suitable novolac resins may also be used in order to adjust the dissolution rate of the exposed coating in aqueous base solutions as well as for adjusting the viscosity, hardness and other physical properties of the coating. Suitable novolac resins are disclosed in numerous patents including U.S. Pat. Nos. 3,148,983; 4,404,357; 4,115,128; 4,377,631; 4,423,138; and 4,424,315, the disclosure of which are incorporated by reference herein.

Aminoplasts may also be used in conjunction with polyglutarimides, prepared according to U.S. Pat. No. 4,246,374, having a weight average molecular weight ranging from about 1000 to about 100,000, which are soluble in aqueous base and contain at least 40 weight percent of the nitrogen atoms in the NH or ammonia form. When polyglutarimides are used in conjunction with aminoplast resins, the aminoplast is present at a concentration of from about 20 to about 80 percent by weight based on the weight of the polyglutarimide.

Alkali soluble polyvinylphenols having a weight average molecular weight ranging from about 2000 to about 100,000 can also be employed with aminoplasts to form useful acid hardening resin systems. These coatings yield thermally stable images capable of withstanding heating for about 30 minutes at temperatures ranging from about 400° to about 500° C.

An alkali-soluble (meth)acrylic acid-styrene copolymer containing at least 15 weight percent, and preferably 30 weight percent, (meth)acrylic acid and having a weight average molecular weight of about 12,000 can also be used in combination with aminoplasts to form an acid hardening resin system useful in the practice of the invention.

Acid hardening resin systems useful in the photosensitive coatings of the invention can also be prepared from phenoplasts by combining a compound that is a latent source of formaldehyde in an acidic media with a novolac resin.

The acid hardening phenoplast-containing resin system can also be formulated with alkali-soluble polyvinylphenols, having weight average molecular weights ranging from about 2000 to about 50,000 and preferable about 2000 to about 20,000, in place of the novolac resins. The useful concentration of the latent formaldehyde generator or phenoplast in the acid hardening resin system has been found to be from about 3 to about 30 percent by weight based on the weight of the novolac or polyvinylphenol resin.

Photoactive Compounds

The photosensitizers and photoacid generators selected are compatible with the acid hardening resin systems and solvent systems such that uniform, adherent films of high quality can be formed therefrom on substrate surfaces. The photosensitizers are also preferably selected such that they do not produce a sufficient amount of acid to cause the acid-hardening resin to react in response to light at wavelengths longer than the near UV and do not sensitize the other photoacid generator compounds present in the photoresist to the effects of such light. The photosensitizers are also selected such that they are stable in photoresist mixtures for up to one year at ambient temperature so as not to change in lithographically important parameters such as viscosity, photospeed, development characteristics and the like.

The selected photoactive compounds employed in the present invention are not novel compounds and are known to possess photoactivity. They are not known, however, to be useful as photosensitizers in photoresists containing acid hardening resin systems.

"Photosensitizers" as used herein refers to the ability of the photoactive compound to activate, or sensitize, a photoacid generator, such as for example, those disclosed in my copending application Ser. No. 818,430, which are hereby incorporated by reference herein, to produce acid for the catalysis of the acid hardening resin. "Photoacid generator" as used herein refers to a compound or polymer which generates an acid for the catalysis of the acid hardening resin system upon exposure to actinic radiation.

These photoactive compounds have the common ability, however, to sensitize or activate photoacid generators which by themselves do not generate acid upon exposure to near UV radiation having wavelengths of from about 365 to about 406 nm. Although the exact mechanism of the sensitizing reaction is unknown in the present case, it is believed that the photoactive compound acts as a photosensitizer when it absorbs the exposing near UV radiation. This causes the compound to go to an excited electronic state from which it may then participate in one of several different kinds of processes to transfer the absorbed energy to the photoacid generator and cause it to produce acid, such as for example, such as for example by: transfer of a photoelectron; dissociation into one or more free radicals which can enter into reactions; dissociation into one or more ions which can enter into reactions; or through excitation transfer involving the formation of an exiplex complex between the halogen compound and the sensitizer.

The phenoxazine and phenothiazine derivative sensitizers can be represented by the formula:

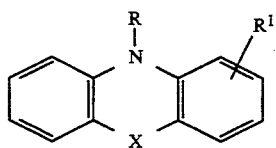

where X is sulfur, or oxygen, R can be hydrogen or $C_1$-$C_6$ alkyl, and $R^1$ can be hydrogen, halogen, $C_1$-$C_6$ alkyl, substituted or unsubstituted. Examples include phenoxazine, phenothiazine, and halo, alkyl or haloalkyl substituted phenothiazines such as 2-chlorophenothiazine and 10-methylphenothiazine. Amino-substituted alkyl substituents, such as in chlorpromazine are to be avoided; a test resist containing chlorpromazine could not be developed after exposure.

These photosensitizers can be used in combination with one or more of the halogenated photoacid generators disclosed in my copending application Ser. No. 818,430 for use with short wavelength actinic radiation. These photoacid generators include: 1,1 -bis [p-chlorophenyl]-2,2,2-trichloroethane (DDT); 1,1 -bis [p-methoxyphenyl]-2,2,2-trichloroethane (Methoxychlor ®); 1,2,5,6,9,10-hexabromocyclododecane; 1,10-dibromodecane; 1,1-bis[p-chlorophenyl]-2,2-dichloroethane; 4,4'-dichloro-2-(trichloromethyl)benzhydrol or 1,1-bis(chlorophenyl)2-2,2-trichloroethanol (Kelthane ®); hexachlorodimethylsulfone; 2-chloro-6-(trichloromethyl)pyridine; O,O-diethyl-O-(3,5,6-trichloro-2-pyridyl)phosphorothioate (Dursban ®); 1,2,3,4,5,6-hexachlorocyclohexane; N(1,1-bis [p-chlorophenyl]-2,2,2-trichoroethylacetamide, tris[2,3-dibromopropyl]isocyanurate; 2,2-bis [p-chlorophenyl]-1,1-dichloroethylene; and their isomers, analogs, homologs and residual compounds.

"Residual" compounds are intended to include closely related impurities or other modifications of the above halogenated organic compounds which result during their synthesis and which may be present in minor amounts in commercial products containing a major amount of the above compounds. Residual compounds include those known in the art such as for example those described in U.S. Pat. No. 2,812,280.

The preferred deep UV photoacid generators are: DDT, Methoxychlor, Kelthane, tris(2,3-dibromopropyl)-isocyanurate, and 2,2,2-tribromoethanol.

I have found that certain of the selected photoactive compounds are preferred. For example, 2-chlorophenothiazine is a preferred photoacid generator at 406 and 365 nanometers. In addition, the combination of phenothiazine as a photosensitizer with 2 chlorophenothiazine as photoacid generator is a preferred combination at 406 and 365 nanometers.

Other photoacid generators that are useful in the near UV can be used with acid hardening resins including dichloroacetophenone derivatives, substituted and unsubstituted N-methylquinolinium salts, such as for example para-toluene sulfonate, and N-alkoxypyridinium salts such as are described in U.S. Pat. No. 2,971,002.

The concentration of the photoactive compound required to be used with an acid hardening resin system depends on whether the photoactive compound is being employed as a photosensitizer or photoacid generator. In the case where the photoactive compound is employed as a photosensitizer it can be used at a concentration of from about 0.5 to about 25 percent by weight on total solids (including acid hardening resin and photoacid generator). In the case where the photoactive compound is being used as a photoacid generator its concentration ranges from about 0.5 to about 25 percent by weight on total solids.

Accordingly, the overall composition of a near UV photoresist employing the photoactive compounds of the present invention is from about 99 to about 75 wt % acid hardening resin, 1 to about 25 wt % photoactive photosensitizer or photoacid generator.

The near UV photoresist may be formulated by admixing the photoactive compound and other photoacid generator with the acid hardening resin in solvent. The mixture is stirred until a homogeneous solution is obtained.

The solvent systems used to formulate the photoactive compound or mixture thereof with photoacid generator and acid hardening resin includes typically non-reacting solvents which have been found to be useful with the acid hardening resins and photoacid generators of the photosensitive coating composition of the invention includes: glycol ethers, such as ethylene glycol monomethyl ether, ethylene glycol monoethyl ether, ethylene glycol dimethyl ether, Proposol ® B and P and the like; Cellosolve ® esters, such as methyl Cellosolve acetate, ethyl Cellosolve acetate and the acetates of Proposol ® B and P, and the like; aromatic hydrocarbons; such as toulene, xylene and the like; ketones, such as acetone, methylethylketone, cyclopentanone, cyclohexanone and the like; esters, such as ethylacetate, butyl acetate, isobutyl isobutyrate, butyrolactone and the like; amides, such as a dimethyl acetamide (DMAC), N-methyl pyrrolidone (NMP), dimethyl formamide (DMF) and the like; chlorinated hydrocarbons, such as methylene chloride, ethylene dichloride, 1,1,1-trichloroethane, chlorobenzene, ortho-dichlorobenzene and the like; nitrobenzene; dimethylsulfoxide; and mixtures of the above. Mixtures of these compounds, optionally containing minor amounts of other suitable compounds, am also useful as solvents. The photosensitive coating solution contains at least 50 percent by weight solvent and preferably from about 65 to 95 percent by weight solvent. The solvent system used must not react adversely with the other components in the coating solution and the coating formed therefrom must be of a homogeneous nature free from sediment, crystallized components, particulates and dirt.

The photoresist may then be applied to a substrate surface as by spinning, dipping or other conventional coating techniques.

For example, when spin coating is utilized, the solids content of the coating solution can be adjusted to provide the film with the thickness desired based on the type of spinning equipment utilized, the viscosity of the solution, the RPM of the spinner and the amount of time allowed for the spinning process.

When the photosensitive coating composition of the invention are used as photoresists, spin coating of the solution coating is particularly suitable for depositing an adherent, uniform film on the surface of a substrate, such as, for example, the surface of silicon or silicon dixoide coated wafers used in the production of microprocessors and other miniaturized integrated circuit components. Aluminum-aluminum oxide and silicon nitride coated wafers can also be coated with the photosensitive coatings of the invention and the resulting films show excellent adhesion to the substrates.

Electronic devices, such as silicon Wafers containing complete electronic circuits, can be coated with the photosensitive coating composition of the invention using the above techniques to provide protection and insulation for the electronic components. These protective coatings reduce the effects of dirt, electrical contaminants, moisture, alpha particles and handling damage, while at the time time permitting certain areas of the coating to be removed for the purpose of attaching electrical contacts. Areas of the surface that are desired to be cleared of the coating in order to subsequently make electrical connections can be accomplished by exposing these areas using a photomask and proceeding by the other steps of the process of the invention while leaving a thermally stable protective coating. In addition, these coatings may serve as useful dielectric and insulating layers for electronic devices.

Planarizing films or layers up to about 10 micrometers in thickness can also be deposited using the abovetechniques on surfaces, so as to planarize microelectronic devices and aluminum relief structures present on the wafer surface.

The resist exhibits low absorbance at the exposing wavelength of 365 nanometers. Unlike high absorbing resists, a low absorbance resist allows the exposing radiation to pass through the resist to the substrate even at low exposure doses. When a low absorbance resist is fully exposed and heated the walls of the resist have a straight veretical profile. High absorbance resists typically have undercut sides, which are undesired.

It has been found that because the photosensitive coating composition can be applied as an adherent, uniform film of desired thickness on a surface, the coating is particularly useful in forming thermally stable planarizing layers on surfaces. Accordingly, the coating can be applied to surfaces of non-uniform topography as a protective coating or photoresist of thickness sufficient to uniformly protect all the surface irregularities.

In addition, since the imaged photoresist is crosslinked and insoluble in spinning solvent and capable of submicron image resolution, multiple thermally stable images can be built, one on top of the other, so as to form a three dimensional grid matrix. A matrix of sets of parallel lines may thus be formed, each set intersecting the previous set of lines at angles relative to the previous set varying from a right angle to nearly parallel, with subsequent sets optionally being parallel to other sets so long as they intersect at least one previous set. In this manner, a thermally stable screen or filter can be formed on the surface. In addition, as a result of the thermal stability and high image resolution achievable with the photosensitive coating composition of the invention, two dimensional filters can also be prepared according to the process of the invention. After the solution coating has been applied to the substrate surface, the substrate is baked to remove residual solvent, forming a film or coating. It is important for achieving reproducible results during the subsequent exposure and development steps that the residual solvent level be accurately controlled. Baking the substrate containing the solution coating at about 90° C. to about 100° C. for about 30 minutes has been found to satisfactorily dry the film. Alternative methods such as hot-plate heating with controlled times and temperatures can also give suitable results.

The dried film, which is substantially free of solvent, should be touch-tack free (TTF) so that dust and dirt will not accumulate by adhesion to the film. TTF formation is also important to prevent adhesion of the coated substrate to a photomask during contact exposure. To determine if a TTF film has been formed, after drying, cotton fibers of a small cotton ball must not cling to the film when touched thereto.

When the photosensitive coating composition is used as a photoresist to form thermally stable images on silicon wafers, it is preferred to pretreat the wafers with a silylamine derivative, such as hexamethyldisilazane or chloromethylsilane or the like.

After the photosensitive film is deposited on a surface and exposed by conventional techniques to actinic radiation as through a photomask, and then baked the film can be developed to form a negative image.

To prepare a thermally stable negative image, the latent image in the exposed photosensitive film areas, which contains acid released by the photosensitive compounds is heated to from 70° C. to about 120° C. to form a thermoset or hardened image and the unexposed portions of the film are dissolved away using the aqueous base developer solution. The remaining thermoset image can be heated (hard baked) to temperatures from about 100° to about 125° C. to form a high quality thermally stable negative image.

In the practice of the process of the invention the developer can be an aqueous solution of inorganic alkali such as sodium hydroxide, potassium hydroxide, sodium carbonate, sodium bicarbonate, sodium silicate, sodium metasilicate, aqueous ammonia or the like or aqueous solutions of an organic alkali such as choline base and tetra-methyl, -ethyl, -hydroxyethyl, -propyl, -butyl, ammonium hydroxide solutions in water, primary amines; for example ethylamine, n-propylamine and the like; secondary amines, for example diethylamine, di-n-propyl amine and the like, tertiary amines, for example triethylamine, methyldiethylamine and the like; alcohol amines, for example dimethylethanolamine, triethanol-ammonium hydroxide and the like; cyclic amines for example pyrrole, piperidine, 1-alphadiazabicyclo (5,4,0)-7-undecane (DBU), 1,5-diazabicyclo (4,3,0)-5-nonane (DBN) and the like can be utilized. In addition, minor amounts of from about 0.1 to about 20 weight percent of the developer solution of water soluble organic solvents, such as for example, methanol, ethanol, isopropanol, n-propanol, Cellosolve® or the like, or a surfactant such as Triton® X-100, may be added to the aqueous base developer. Other developers suitable for use in the practice of the process of the invention are disclosed in U.S. Pat. Nos. 3,110,596; 3,173,788; 3,586,504 and 4,423,138.

After a thermally stable crosslinked image has been formed on the substrate surface, a second photosensitive film may be applied directly over the first image and onto the remaining portions of the substrate and processed again for example to form a planarizing layers or a second layer of new images on top of the first set.

If the crosslinked image is desired to be removed from the substrate surface, the image may be stripped using oxygen plasma treatment or by the use of a stripping solution at elevated temperatures on the order of 75° C. to about 180° C. Suitable stripping solutions include N-methylpyrolidone (NMP), dimethyl sulfoxide, dimethyl formamide or NMP and the monomethyl ether of ethylene glycol and the like as disclosed in U.S. Pat. No. 4,428,871. It may also be flood exposed with 1-5 j/cm$^2$ of 254 nanometer light to photodegrade it so that it becomes soluble in organic solvents such as acetone, MEK, MDC, etc.

Resists according to the invention exhibit low absorbance to the exposing wavelengths. When a low absorbance resist is underexposed, a low concentration of acid is produced through the depth of the resist. When an underexposed low absorbance resist is heated it produces a matrix of lightly crosslinked resin. The uncrosslinked resin fraction is extracted during development and the image shrinks in height, producing an image that is less than the full thickness of the resist. If images of this type are observed using low absorbance resist either the exposure dose or the concentration of photosensitive compound may need to be increased.

It is envisioned that a mask could be prepared to produce multiple images of an enantiomorphic structure that is not superimposable with its mirror image using resist according to the invention. If these images were prepared near the dimensions of a wavelength of light and metal plated to make them conductive, it is believed that a beam of plane polarized light would be rotated by the structures. Multiple copies of the structure could be arrayed on a surface and used to polarize ordinary light by reflection or transmission, or a suspension of free-floating enantiomorphic structures could be used.

The following examples are presented to further illustrate the invention and are not intended to limit the breadth of the invention.

GLOSSARY

The following abbreviations appear in the data reported and have the indicated meaning:

CPTZ = 2-chlorophenothiazine

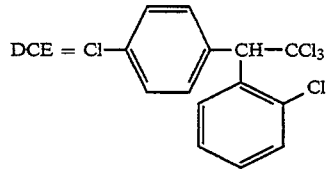

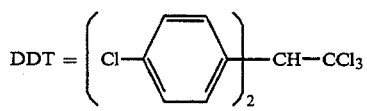

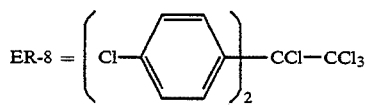

DCPP = Tris (2,3-dichloropropyl)phosphate

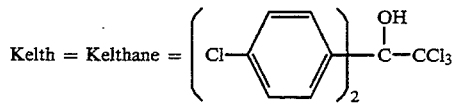

T = tris (2,3-dibromopropyl)isocyanurate

TBE = 2,2,2-tribromoethanol

EXAMPLE 1

Resist solutions were prepared by mixing the following ingredients:

|  | Solution | Solids |
|---|---|---|
| a) Novolac resin 30% solids | 10.00 g | (3.00 g) ] |
|  |  | + } = (AHR) 3.60 g |
| b) Cymel 303 (Methylolated melamine resin) | 0.60 g | (0.60 g) ] |
| c) Photoacid Generator-tris (2,3 dibromopropyl)-isocyanurate | 0.36 g | (0.36 g) = (PAG) |
| d) Photosensitizer Candidate (1%) | 0.036 g | (0.036 g) = (SEN) |

Acid Hardening Resin (AHR) was prepared by mixing novolac and aminoplast resin (Cymel 303) in proportions such that the amount of aminoplast was 20% of the novolac resin solids by weight. In the following tables the amount of photoacid generator (PAG) and photosensitizer (SEN) are reported as percentages by weight based on the acid hardening resin. The amount of acid hardening resin is the which is the sum of novolac and amino resin solids. For example, in the formulation described above the amount of PAG is 10% by weight calculated on AHR and the amount of Photosensitizer (SEN) is 1% by weight calculated on AHR.

The photoresists were prepared under yellow safe lights. They were spin coated at 3-4000 RPM on silicon wafers with a thin silicon dioxide surface layer (70 um), which were first primed with hexamethyldisilazane (HMDS).

The coated wafers were prebaked at 90° C. for 30 min. to remove solvent and then cooled to ambient temperature. The coating thickness was then measured with a Dektak Model 30-30 profilometer. Wafers were then imaged by contact printing using an Optiline step wedge mask in a Hybrid Technology Group Model L84-5X contact printer. An exposure of 150 mj/cm$^2$ at 365 nm was used in the initial screening. In early experiments, exposures were to broad band radiation using only the dichroic mirrors of the printer for wavelength definition. In experiments where the exposure dose is identified with an asterisk, a narrow ±10nm bandpass filter was used for a more precise measure of sensitivity.

After exposure, the wafers were postbaked at 90° C. for 30 minutes to crosslink via reaction between the amino resin and novolac. After cooling, the wafers were developed using Shipley Microposit 351 developer generally diluted 1 part developer to 2-3 parts water. At times, the dilution was changed with other resin formulations so that an unexposed composition would be removed from the wafer in 1-2 minutes.

The exposed wafers were developed until unexposed areas were clear of photoresist, and then washed with cold water followed by air drying for about 30 minutes at room temperature. The thickness of the photoresist in an area that received 100% exposure was then measured and the percentage resist retained was calculated based upon the initial thickness.

Table I below illustrates the surprising effectiveness of phenothiazine as a sensitizer for tris-(2,3-dibromopropyl)isocyanurate photoacid generator in an acid hardening resin system. The effectiveness of the resist is measured as percentage of the thickness of resist that is retained as a negative image after development.

TABLE I

% Sensitizer and PAG added based upon the Acid Hardening Resin MIxture

|  |  | Sensitizer | PAG | % resist retained |
|---|---|---|---|---|
| Example 1 | Phenothiazine | 1 | 10 | 92% |
|  | Diphenylamine | 1 | 10 | 9% |
|  | Triphenylamine | 1 | 10 | 44% |
|  | N-phenyl-1-naphthyl-amine | 1 | 10 | 67% |
|  | Malachite Green Base | 1 | 10 | 0% |
|  | Acridine | 1 | 10 | 0% |
|  | No sensitizer | 0 | 10 | 0% |

The table demonstrates that phenothiazine is surprisingly effective as a sensitizer for tris-(2,3-dibromopropyl) isocyanurate, a photoacid generator that otherwise does not respond to near ultraviolet radiation at 365 nm.

| % Retained/Dose | | Sensitizer | PAG | AR | % Based Upon Weight of AHR | |
|---|---|---|---|---|---|---|
| 365 | 406 | | | | Sen | PAG |
| A 92/100 | | Phenothiazine | T | C303 | 1 | 10 |
| B 95/150 94/50* 41/20* | | Phenothiazine | DDT | C303 | 1 | 10 |
| C 87/20* | 40/150 | Phenothiazine | DDT | C303 | 5 | 10 |
| D 94/150 | | Phenothiazine | Kelth | C303 | 1 | 10 |
| E 93/150 | | Phenothiazine | Methox | C303 | 1 | 10 |
| F 151/0* | | Phenothiazine | DCE | C303 | 1 | 10 |

-continued

| % Retained/Dose | | Sensitizer | PAG | AR | % Based Upon Weight of AHR | |
|---|---|---|---|---|---|---|
| 365 | 406 | | | | Sen | PAG |
| 71/150 | | azine | | | | |
| G 93/150 59/50* 25/20* | | Phenothiazine | TBE | C303 | 1 | 10 |
| H 84/150 49/50* | | Phenothiazine | TBE | C303 | 1 | 10 |
| I 94/150 69/120* | | Phenothiazine | 2TCMQ | C303 | 1 | 10 |
| J 25/150 | | Phenothiazine | DCPP | C303 | 1 | 10 |
| K 37/150 | | Phenothiazine | DCPP | C303 | 1 | 10 |
| L 56/150 | | Phenothiazine | DCPP | C303 | 4 | 10 |
| M 82/150 40/40* | | Phenothiazine | DCPP | C303 | 10 | 10 |
| N 80/150 39/40* | | Phenothiazine | DCPP | C303 | 10 | 1 |
| O 52/150 | | Phenothiazine | DCPP | C303 | 10 | 1 |
| P 94/50* 91/20* 69/5* | | Phenothiazine | ER-8 | C303 | 5 | 10 |
| Q 89/50* 100/20* 80/25* | | Phenothiazine | ER-8 | C1123 | 5 | 10 |
| R 48/50* 57/20* | | Phenothiazine | ER-8 | C1171 | 5 | 10 |
| S 97/50* 70/5* | | Phenothiazine | ER-8 | Be60 | 5 | 10 |
| T 93/50* | | Phenothiazine | ER-8 | C1158 | 5 | 10 |
| U 92/20* | 74/150 | Phenothiazine | CPTZ | C303 | 5 | 10 |
| V 94/20* | 73/150* | 10-Methylphenothiazine | CPTZ | C303 | 5 | 10 |
| W 78/20* | 60/150 | Phenothiazine | CHI$_3$ | C303 | 5 | 10 |

*This exposure was conducted through a bandpass filter which allowed passage of light at the indicated wavelength +/− 10 nm.

The data demonstrates that phenothiazine sensitizes various photoacid generators to near UV radiation at 365 nm. Note that the phenothiazine sensitized acid hardening resin resist exhibited good retention upon development, often exceeding 90% of the original thickness.

TABLE III

Resists were prepared and processed as desecribed as in Example I. Phenothiazine derivatives and phenoxazine were used as the sensitizers as shown.

| % Retained/Dose | | Sensitizer | PAG | AR | % Based Upon Weight of AHR | |
|---|---|---|---|---|---|---|
| 365 | 406 | | | | Sen | PAG |
| X 80/50* | | 10-Methylphenothiazine | DDT | C303 | 5 | 10 |
| Y 54/150 8/40* 5/20* | 5/150* | 2Trifloromethylphenothiazine | T | C303 | 1 | 10 |
| Z 94/150 57/40* 33/20* 8/5* | 18/150* | 2-Chlorophenothiazine | T | C303 | 1 | 10 |
| AA 17/20* | 0/150* | 10-Methylphenothiazine | T | C303 | 5 | 10 |
| AB 73/20* | 85/150* | Phenoxazine | CHI$_3$ | C303 | 1 | 10 |

TABLE III-continued

Resists were prepared and processed as desecribed as in Example I. Phenothiazine derivatives and phenoxazine were used as the sensitizers as shown.

| % Retained/Dose | | Sensitizer | PAG | AR | % Based Upon Weight of AHR | |
|---|---|---|---|---|---|---|
| 365 | 406 | | | | Sen | PAG |
| | | zine | | | | |

TABLE IV

Resists were prepared using 2-chlorophenothiazine as the photoacid generator. The data demonstrates the surprising effectiveness of 2-chlorophenothiazine as a photoacid generator at 365 nm and 406 nm.

| | % Retained/Dose | | PAG | AR | % Based Upon Weight of AHR PAG |
|---|---|---|---|---|---|
| | 365 | 406 | | | |
| AC | 99/150<br>92/40*<br>100/20<br>98/10*<br>55/5* | 86/150*<br>26/50* | 2-Chlorophenothiazine | C303 | 10 |
| AD | 92/20* | 92/150 | 2-Chlorophenothiazine | C303 | 10 |
| AE | 98/20* | 92/150* | 2-Chlorophenothiazine | C303 | 15 |
| AF | 87/20* | | 2-Chlorophenothiazine | C303 | 20 |
| AG | 100/20* | | 2-Chlorophenothiazine | C303 | 25 |

TABLE V

Resists were prepared and processed as described in Example 1 except that the amount of sensitizer and photoacid generator was varied as shown.

| | % Retained/Dose | | Sensitizer | PAG | AR | % Based Upon Weight of AHR | |
|---|---|---|---|---|---|---|---|
| | 365 | 406 | | | | Sen | PAG |
| AH | 30/150<br>15/20* | | Phenothiazine | T | C303 | 1 | 1 |
| AI | 81/150<br>37/40* | | Phenothiazine | T | C303 | 4 | 1 |
| AJ | 98/150<br>90/40*<br>55/20* | | Phenothiazine | T | C303 | 4 | 10 |
| AK | 91/50<br>72/20* | | Phenothiazine | T | C303 | 10 | 1 |
| AL | 90/40*<br>78/20*<br>28/5* | | Phenothiazine | T | C303 | 10 | 5 |
| AM | 94/40*<br>81/20*<br>49/5* | | Phenothiazine | T | C303 | 10 | 10 |
| AN | 93/40*<br>96/20*<br>595* | | Phenothiazine | T | C303 | 10 | 15 |
| AO | 87/40*<br>61/20* | | Phenothiazine | T | C303 | 15 | 1 |
| AP | 91/40*<br>52/5* | | Phenothiazine | T | C303 | 15 | 5 |
| AQ | 100/49*<br>97/20*<br>66/5* | | Phenothiazine | T | C303 | 15 | 10 |
| AR | 0/40* | | Phenothiazine | None | C303 | 15 | 0 |
| AS | 0/40 | | Phenothiazine | T | C303 | 0 | 15 |
| AT | 100/40*<br>48/5* | | Phenothiazine | T | C303 | 20 | 5 |
| AU | 81/40* | | Phenothiazine | T | C303 | 5 | 10 |
| AV | 83/40* | | Phenothiazine | T | C303 | 5 | 10 |
| AW | 81/40* | | Phenothiazine | T | C303 | 5 | 10 |
| AX | 52/10* | | Phenothiazine | TBE | C303 | 5 | 10 |
| AY | 62/20* | 25/150* | Phenothiazine | T | C303 | 5 | 10 |

TABLE VI

Resists were prepared using different Acid hardening resins as shown. The data demonstrates that resists containing various acid hardening resins can be prepared according to the invention.

| | % Retained/Dose | | Sensitizer | PAG | AR | % Based Upon Weight of AHR | |
|---|---|---|---|---|---|---|---|
| | 365 | 406 | | | | Sen | PAG |
| AZ | 41/150 | | Phenothiazine | T | C380 | 5 | 10 |
| BA | 48/150 | | Phenothiazine | T | C1168 | 5 | 10 |
| BB | 39/150 | | Phenothiazine | T | C1170 | 5 | 10 |
| BC | 32/150 | | Phenothiazine | T | C1171 | 5 | 10 |
| BD | 70/150 | | Phenothiazine | T | C1123 | 5 | 10 |
| BE | 28/150 | | Phenothiazine | T | C1134 | 5 | 10 |

EXAMPLE 3

Thick Negative Images

A resist solution was prepared by mixing 100 grams of 30% solids novolac resin, 6.00 grams of Cymel 303, 3.6 grams of tris-(2,3-dibromopropyl)isocyanurate and 1.80 grams of phenothiazine. A wafer was coated with a thick layer of the resist solution using an airbrush, and baked. The wafer was exposed at 365 nanometers through a photomask of the type described in Ser. No. 818,571, baked to crosslink and washed with developer. Three dimensional images were produced that were 250 microns thick with straight side wall profiles, in the fully exposed areas of the mask and with thinner surface relief areas where the light was attenuated by the mask.

EXAMPLE 4

Free-floating Images—Product Identification

A wafer was coated with a 10% aqueous solution of a 2000 molecular weight polyvinyl alcohol (Aldrich Chemical Company) by spin coating at 3000–4000 RPM to produce a 0.1 micrometer thick dry film and baked for 30 minutes at 90 degrees C. The wafer was then coated with a 1-3 micrometer layer of resist prepared by mixing 100 grams of 30% solids novolac resin, 6.00 grams of Cymel 303, 3.6 grams of tris-(2,3-dibromopropyl)isocyanurate and 1.80 grams of phenothiazine. The resist was baked for 30 minutes at 90 degrees C., and exposed at 365 nanometers by contact printing using a mask that contained clear areas that described the shape of symbols on a 10 micrometer scale. After baking for 30 minutes at 90 degrees C. to crosslink the images the wafer was washed with dilute aqueous developer. The images of symbols were collected by centrifugation, washed with water and then with dilute acetic acid and dried. If made in distinctly recognizeable shapes, these free-floating images may be used as identification markers for example in solid or liquid products or in paper such as currency, bonds, etc. to prevent counterfeiting. The images may carry the identifying information in the form of symbols or characters that are directly observable using magnification equipment or may be made in distinctly identifying shapes that are paired with identifying information in an index. The markers could also be tagged to ease detection for example using fluorescent dyes, magnetic fillers and the like.

What is claimed is:

1. A method for producing high resolution negative photoresist images comprising pattern wise exposing a photoresist to near ultraviolet radiation, said photoresist comprising in admixture from about 0.5 to 25 percent of a member selected from the group consisting essentially of phenothiazine and phenothiazine derivatives, from about 0.5 to 25 percent of a deep UV halogenated photoacid generator that is not a metal halide-containing onium salt and from about 50 to 98 percent of an acid hardening resin system consisting essentially of an aminoplast and a reactive hydrogen-containing compound selected from the group consisting essentially of a novolak resin and a polyvinyl phenol, heating said photoresist, and developing the photoresist to form an image by removing unexposed areas with a developer.

2. A method for producing high resolution negative photoresist images comprising exposing portions of a layer of photoresist composition of near ultraviolet radiation in a pattern, said photoresist comprising in admixture from about 50 to 98 percent acid hardening resin consisting essentially of an aminoplast and a reactive hydrogen-containing compound selected from the group consisting essentially of a novolak resin and a polyvinyl phenol, from about 0.5 to 25 percent of a deep UV photoacid generator other than a metal halide-containing onium salt that does not generate an effective amount of acid in response to near ultraviolet radiation and from about 0.5 to 25 percent of a sensitizer of the formula:

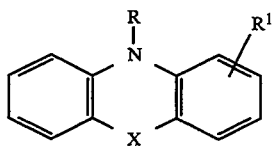

where X is sulfur or oxygen, R can be hydrogen or $C_1$-$C_3$ alkyl, and $R^1$ can be hydrogen, halogen or $C_1$-$C_6$ alkyl substituted or unsubstituted, which renders said photoacid generator sensitive to near ultraviolet radiation, heating said photoresist to selectively crosslink the photoresist in exposed areas, and developing the image by selectively removing the unexposed portions of the photoresist.

3. A method for producing high resolution negative photoresist images comprising exposing a photoresist composition to near ultraviolet radiation, said photoresist consisting essentially of, in admixture, an acid hardening resin system and from about 0.5 to 25 percent 2-chlorophenothiazine as a photoacid generator; heating said photoresist to selectively crosslink the photoresist in exposed areas; and developing the image by selectively removing the unexposed portions of the photoresist.

4. A negative photoresist composition for use with exposing tools that operate using near UV radiation comprising in admixture, from about 50 to 98 percent of an acid hardening resin system consisting essentially of an aminoplast and a reactive hydrogen-containing compound selected from the group consisting essentially of a novolak resin and a polyvinyl phenol, from about 0.5 to 25 percent of a deep UV photoacid generator other than a metal halide-containing onium salt that does not generate sufficient acid in response to near UV radiation and from about 0.5 to 25 percent of a sensitizer of the formula:

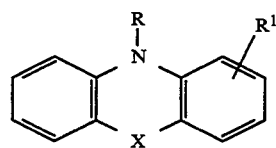

where X is sulfur or oxygen, R is hydrogen or $C_1$-$C_3$ alkyl, and $R^1$ is hydrogen, halogen or $C_1$-$C_6$ alkyl substituted or unsubstituted, which upon exposure to near UV radiation causes the deep UV photoacid generator to generate acid.

5. A negative photoresist composition for use with exposing tools that operate using near UV radiation comprising in admixture, an acid hardening resin system consisting essentially of an aminoplast and a reactive hydrogen-containing compound selected from the group consisting essentially of a novolak resin and a polyvinyl phenol and from about 0.5 to 25 percent 2-chlorophenothiazine as a photoacid generator.

6. A negative photoresist composition for producing relief images which include submicron features and have straight side wall profiles using near UV radiation which comprises the photoresist of claim 4.

7. The photoresist of claim 6 wherein the images include features having a depth greater than 100 microns.

8. The photoresist of claim 7 wherein the images include features having a depth greater than 200 microns.

9. The photoresist of claim 7 wherein the image has more than one surface elevation produced by exposing the resist using a mask that includes opaque, clear and partial light transmitting areas.

10. A method of producing high resolution negative photoresist images comprising pattern wise exposing a photoresist composition to near ultraviolet radiation, said photoresist consisting essentially of, in admixture, from about 0.5 to 25 percent of a member selected from the group consisting essentially of phenothiazine and phenothiazine derivatives, from about 0.5 to 25 percent of a deep UV halogenated photoacid generator and from about 50 to 98 percent of an acid hardening resin system consisting essentially of an aminoplast and a reactive hydrogen-containing compound selected from the group consisting essentially of a novolak resin and a polyvinyl phenol, heating said photoresist, and developing the photoresist to form an image by removing unexposed areas with a developer, wherein the photoacid generator is a halogenated organic compound selected from the group consisting of:

1,1-bis [p-chlorophenyl]-2,2,2-trichloroethane;
1,1-bis [p-methoxyphenyl]-2,2,2-trichloroethane;

1,2,5,6,9,10-hexabromocyclododecane;
1,10-dibromodecane;
1,1-bis[p-chlorophenyl]-2,2-dichloroethane;
4,4'-dichloro-2-(trichloromethyl) benzhydrol or 1,1-bis(chlorophenyl)2,2,2-trichloroethanol;
hexachlorodimethyl sulfone;
2-chloro-6-(trichloromethyl) pyridine;
O,O-diethyl-O-(3,5,6-trichloro-2-pyridyl) phosphorothioate;
1,2,3,4,5,6-hexachlorocyclohexane;
N(1,1-bis [p-chlorophenyl]-2,2,2-trichloroethyl) acetamide, tris [2,3-dibromopropyl] isocyanurate;
1,1-bis [p-chlorophenyl]-2,2-dichloroethylene;
and their isomers, analogs, and homologs.

11. A negative photoresist composition for use with exposing tools that operate using near UV radiation consisting essentially of, in admixture, from about 50 to 98 percent of an acid hardening resin system consisting essentially of an aminoplast and a reactive hydrogen-containing compound selected from the group consisting essentially of a novolak resin and a polyvinyl phenol, from about 0.5 to 25 percent of a deep UV photoacid generator other than a metal halide-containing onium salt that does not generate sufficient acid in response to near UV radiation and from about 0.5 to 25 percent of a sensitizer of the formula:

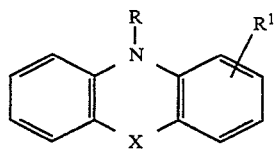

where X is sulfur or oxygen, R is hydrogen or $C_1$–$C_3$ alkyl, and $R^1$ is hydrogen, halogen or $C_1$–$C_6$ alkyl substituted or unsubstituted, which upon exposure to near UV radiation causes the deep UV photoacid generator to generate acid, wherein the photoacid generating compound is a halogenated organic compound selected from the group consisting of:
1,1-bis [p-chlorophenyl]-2,2,2-trichloroethane;
1,1-bis [p-methoxyphenyl]-2,2,2-trichloroethane;
1,2,5,6,9,10-hexabromocyclododecane;
1,10-dibromodecane;
1,1-bis[p-chlorophenyl]-2,2-dichloroethane;
4,4'-dichloro-2-(trichloromethyl) benzhydrol or 1,1-bis(chlorophenyl)2,2,2-trichloroethanol;
hexachlorodimethyl sulfone;
2-chloro-6-(trichloromethyl) pyridine;
O,O-diethyl-O-(3,5,6-trichloro-2-pyridyl) phosphorothioate;
1,2,3,4,5,6-hexachlorocyclohexane;
N(1,1-bis [p-chlorophenyl]-2,2,2-trichloroethyl) acetamide, tris [2,3-dibromopropyl] isocyanurate;
1,1-bis [p-chlorophenyl]-2,2-dichloroethylene;
and their isomers, analogs, and homologs.

* * * * *